(12) United States Patent
Tamaki et al.

(10) Patent No.: US 9,190,585 B2
(45) Date of Patent: Nov. 17, 2015

(54) LIGHT EMITTING DEVICE AND LIGHTING EQUIPMENT

(71) Applicant: Nichia Corporation, Tokushima (JP)

(72) Inventors: Hiroto Tamaki, Tokushima (JP); Eiko Minato, Tokushima (JP); Takahiro Tani, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 13/739,802

(22) Filed: Jan. 11, 2013

(65) Prior Publication Data

US 2013/0181236 A1 Jul. 18, 2013

(30) Foreign Application Priority Data

Jan. 13, 2012 (JP) ................................. 2012-4574

(51) Int. Cl.
*H01L 33/56* (2010.01)
*H01L 33/44* (2010.01)
*H01L 33/48* (2010.01)
*H01L 33/62* (2010.01)

(52) U.S. Cl.
CPC ............... *H01L 33/56* (2013.01); *H01L 33/44* (2013.01); *H01L 33/486* (2013.01); *H01L 33/62* (2013.01); *H01L 2224/16245* (2013.01); *H01L 2924/01322* (2013.01)

(58) Field of Classification Search
None
See application file for complete search history.

(56) References Cited

U.S. PATENT DOCUMENTS

| 5,670,797 | A * | 9/1997 | Okazaki | 257/91 |
| 6,680,490 | B2 * | 1/2004 | Yasukawa et al. | 257/98 |
| 2006/0043382 | A1 * | 3/2006 | Matsui et al. | 257/79 |
| 2008/0023721 | A1 * | 1/2008 | Lee et al. | 257/99 |
| 2008/0157113 | A1 * | 7/2008 | Hayashi | 257/98 |
| 2008/0191232 | A1 * | 8/2008 | Lee et al. | 257/98 |
| 2009/0010017 | A1 | 1/2009 | Hayashi et al. | |
| 2010/0029887 | A1 * | 2/2010 | Hamamoto et al. | 528/12 |
| 2010/0193822 | A1 | 8/2010 | Inobe et al. | |
| 2010/0247955 | A1 * | 9/2010 | Takahashi et al. | 428/647 |
| 2010/0314654 | A1 * | 12/2010 | Hayashi | 257/99 |
| 2012/0007119 | A1 * | 1/2012 | Shiobara et al. | 257/98 |

FOREIGN PATENT DOCUMENTS

| JP | 2007-109915 | 4/2007 |
| JP | 2007-324256 | 12/2007 |
| JP | 2008-258350 A | 10/2008 |
| JP | 2009-33107 A | 2/2009 |
| JP | 2009-068007 A | 4/2009 |
| JP | 2009-224536 | 10/2009 |
| JP | 2010-199547 A | 9/2010 |

OTHER PUBLICATIONS

Computerized translation of Sugino et al (JP-2007109915) from AINP Machine Translation (JPO), using Math/Physics, Electronic Engineering and Chemistry libraries.*
Japanese Office Action dated Jun. 23, 2015 issued in Application No. 2012-004574.

* cited by examiner

*Primary Examiner* — Johannes P Mondt
(74) *Attorney, Agent, or Firm* — Foley & Lardner LLP

(57) ABSTRACT

A light emitting device has a base comprising at least one pair of leads having a silver-containing layer on their surfaces and being secured by a resin molded body, a light emitting element mounted on said leads, a protective film made of an inorganic material that covers the upper surface of said base, and a sealing resin disposed on the base surface via said protective film. The sealing resin has a first resin that covers said light emitting element, and a second resin having a higher hardness than said first resin that covers the boundaries between said resin molded body and said leads.

20 Claims, 7 Drawing Sheets

LIGHT EMITTING DEVICE AND LIGHTING EQUIPMENT

CROSS REFERENCE TO RELATED APPLICATIONS

The present application claims priority to Japanese Application No. JP2012-4574, the contents of which is incorporated by reference in its entirety.

BACKGROUND

1. Field of the Invention

The present disclosure relates to light emitting devices having a silver-containing layer on the surface thereof and lighting equipment using the same.

2. Background Art

Light emitting devices using semiconductor light emitting elements (hereinafter, also simply referred to as "light emitting elements") employ numerous types of resin packages that use leads as electrodes in which silver (Ag) having high reflectivity for the light emitted from light emitting elements is disposed at the outermost surfaces of the leads. However, Ag is highly reactive (sulfurized) in an environment where a corrosive gas, such as a sulfur-containing gas, is present, and thus is susceptible to discoloration and corrosion, reducing the reflectivity and considerably degrading the properties of light emitting devices. Accordingly, attempts have been made to cover the surface of Ag with inorganic materials such as glass. See, for example, Japanese Laid-Open Patent Application Publication No. 2007-324256 and Japanese Laid-Open Patent Application Publication No. 2009-224536

SUMMARY

Problems to be Solved

However, protective films are susceptible to cracking because the coefficients of thermal expansion are different between leads and resins, and the coefficients of linear expansion are different between leads and protective films. A sulfur-containing gas penetrating through such cracks facilitates such discoloration and corrosion.

Means for Solving the Problems

To solve the problems described above, the light emitting device of certain embodiments of the invention has a base comprising at least one pair of leads having a silver-containing layer on their surfaces and being secured by a resin molded body, a light emitting element mounted on the leads, a protective film made of an inorganic material that covers the upper surface of the base, and a sealing resin disposed on the base surface via the protective film. The sealing resin has a first resin that covers the light emitting element, and a second resin, having a higher hardness than the first resin, that covers the boundaries between the resin molded body and the leads. This suppresses the penetration of sulfur-containing gas thereby suppressing discoloration and corrosion.

The above construction suppresses discoloration and corrosion of Ag, thereby providing a light emitting device less susceptible to reflectivity degradation.

DETAILED DESCRIPTION OF THE PREFERRED EMBODIMENTS

Figure 1A:
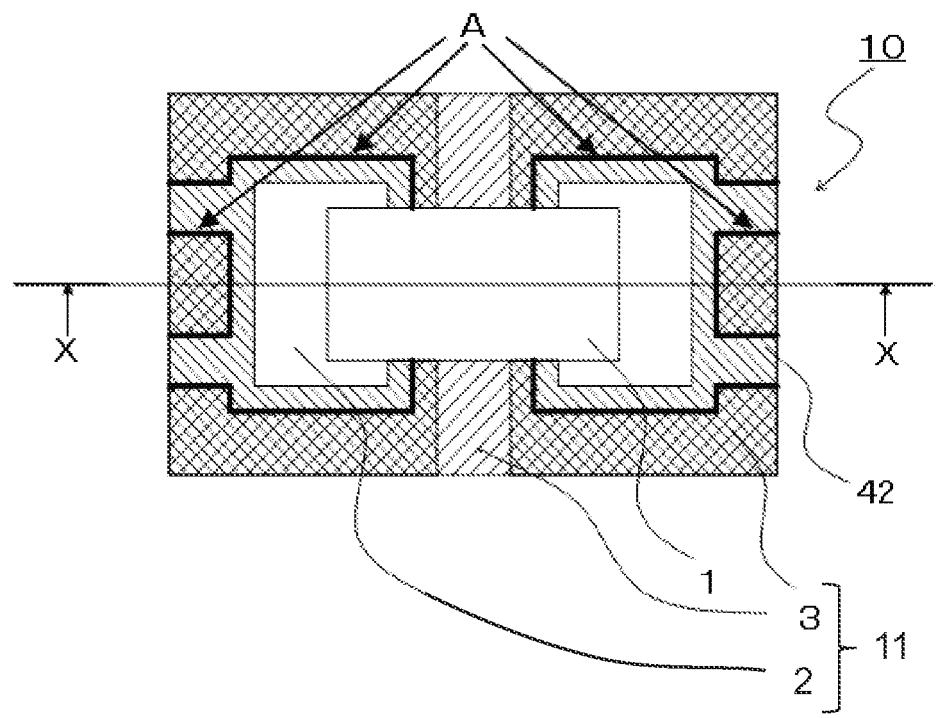
FIG. 1A is a top view of a light emitting device in an embodiment of the invention.

Embodiments of the invention will be explained by referring to the drawings below. The embodiments described below, however, are exemplary light emitting devices for embodying the technical ideas of the invention, and not intended to limit the invention. Moreover, the dimensions, materials, shapes, the relative layouts and the like of the components described in the embodiments are not intended to limit the scope of the invention; they are merely exemplary unless otherwise specifically noted. The sizes and the positional relationship of the components may be exaggerated to make the explanation clear.

1. Light Emitting Device

Figure 1B:
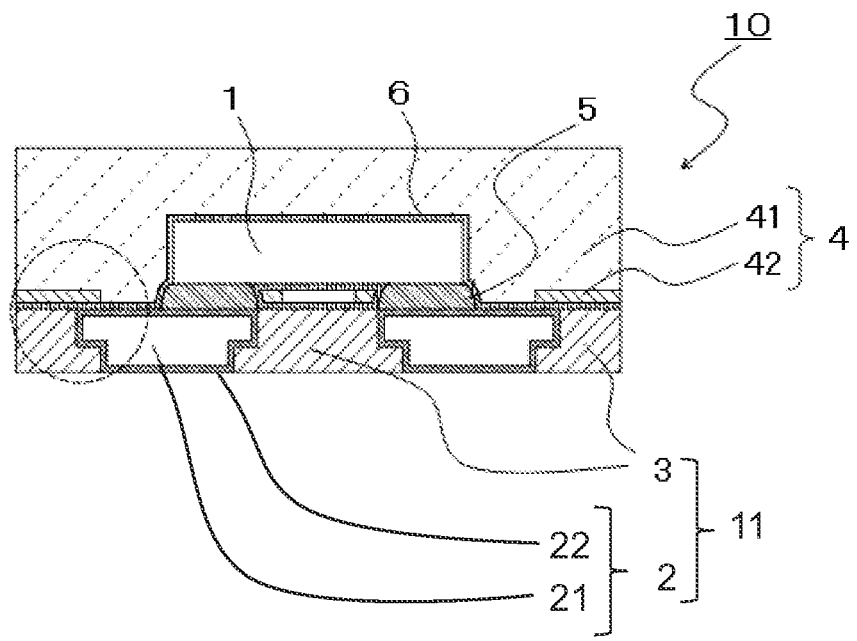
FIG. 1B is a cross section along line X-X in FIG. 1A.
Figure 1C:
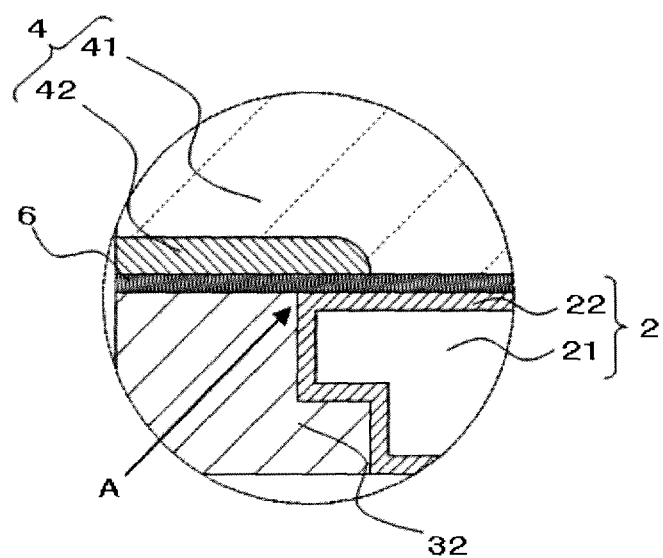
FIG. 1C is a partial enlarged view of FIG. 1B.

The light emitting device in one embodiment of the invention will be explained with reference to FIG. 1. FIG. 1A is a top view of a light emitting device 10, FIG. 1B is a cross section of FIG. 1A along line X-X, and FIG. 1C is a partial enlarged view of same.

Embodiment 1

As shown in FIG. 1A, FIG. 1B, FIG. 1C, and FIG. 1D, the light emitting device 10 has a base 11 integrally comprised of a pair of leads 2, which function as a pair of positive and negative electrodes, and are secured by a resin molded body 3, which is an insulating material. The base 11 is flat in a cross sectional view as in FIG. 1B, and rectangular in a top view as in FIG. 1A. A lead 2 is a plate-shaped member having a silver-containing layer 22 disposed by plating or the like on the surface of a base material 21, which is machined into a desired shape, and a light emitting element 1 is mounted on the lead 2 which forms the upper surface of the base 11, The light emitting element 1, which has positive and negative electrodes on the same plane, is bonded and electrically connected to the leads 2 using a conductive bonding material 5 so as to straddle the two leads 2 (flip chip structure).

The regions of the upper surface of the base 11 excluding the sections where the conductive bonding material 5 is disposed, i.e. the inorganic protective film 6, which is formed on the upper surfaces of the leads 2 and resin molded body 3, is also disposed on the surfaces of the light emitting element 1 (top, side, and bottom surfaces). Moreover, a sealing resin 4 is disposed via the protective film 6 (so as to cover the protective film 6), to form a substantially rectangular cuboid light emitting device 20.

In this embodiment, the sealing resin 4 has a first resin 41 which covers the light emitting element 1, and a second resin 42 which covers the boundaries A between the leads 2 and resin molded body 3. For the resin 42, a resin having a higher hardness than the resin 41 is used. As such, the vicinity of the light emitting element is covered by the protective film 6 whereby the discoloration and corrosion of the silver-containing layer can be prevented, while the second resin 42 can achieve the same effect in the vicinity of the boundaries A.

The boundaries A where the resin molded body 3 comes into contact with the leads 2 are indicated with bold lines in FIG. 1A. More specifically, they are the perimeters of the leads 2 each having a rectangular section for placing a light emitting element, and two extended sections which extend from one side to a side face of the base 11. In the figure, the two leads 2 are symmetrically disposed, the section for placing a light emitting element is disposed so that its perimeter is distantly located from the perimeter of the base 11, and the extended sections are disposed so that their ends extend to the edges of the base 11. In this embodiment, as shown in FIG. 1C, the areas above the boundaries A are covered with the second resin 42 via the protective film 6. It is preferable to cover not only directly above the boundaries A between the leads 2 and the resin molded body 3 with the second resin 42, but also their vicinities, and in cases of a light emitting device similar to that shown in FIG. 1B where the first resin 41 is exposed to the sides of the light emitting device 10, the second resin 42 is disposed so as to reach the side of the base.

Figure 1D:
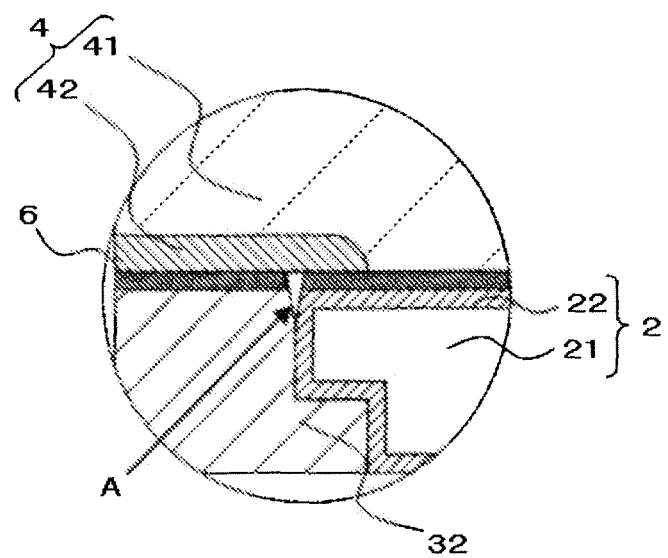
FIG. 1D is a partial enlarged view of FIG. 1B.

The boundaries A include those formed so that the resin molded body 3 (32) and the lead 2 are in contact with one another as shown in FIG. 1C, as well as those where a gap is created between the resin molded body 3 (32) and the lead 2 as shown in FIG. 1D. The gap shown in FIG. 1D is attributable to the fact that materials of a different nature, i.e., resin (resin molded body) and metal (lead) are formed so as to be in contact with one another, and is created in regions where the adhesion or the strength is readily reduced by the difference in their coefficients of thermal expansion, as well as the stress applied in the process following the molding step. In these cases, a crack caused by such a gap is formed in the protective film 6 which is formed continuously span both surfaces of resin molded body 3 (32) and lead 2. The crack created would expose the lead 2 (particularly the silver-containing layer 22) no longer covered by the protective film 6, but by covering the section with the second resin as shown in FIG. 1C, discoloration and corrosion of the silver can be suppressed.

In those instances where a gap or crack is formed at a boundary A, its location, size, or the like varies depending on the process conditions and the characteristics of the resin molded body. Thus, boundaries A include those without any gap or crack, those with a gap or crack in some sections, and those where a gap or crack is formed across the entire region.

In cases where such gaps or cracks are created before disposing the second resin, i.e., they are created in the steps of placing and bonding light emitting elements, wire bonding if wires are used, forming a protective film, or the like, as well as during transport between these steps, the second resin is also formed in the cracks in the protective film as well as the gaps between the resin molded body and the leads.

In cases where the gaps or cracks are created following the formation of the second resin, they are occasionally formed in the process of forming the first resin, during a property inspection (light emission property, or the like) of (an assembly of) the light emitting devices, as well as in the step of dividing the assembly of light emitting devices into discrete pieces (cutting a lead frame or the like), and even in the step of installing a light emitting device in lighting equipment or the like by bonding the device onto a wiring board or the like by soldering or the like. Furthermore, cracks occasionally occur when repeatedly exposed to thermal shocks where lighting equipment having light emitting devices are turned on and off in cold weather locations.

On these occasions, a new gap or crack may be created in a boundary A which had no gaps or cracks in the stages up to the preceding step. The gaps or cracks created in the stages up to the preceding step may be widened (laterally or in the direction of depth), or a new gap or crack may be created at a different location than the gaps and cracks which had been created in the stages up to the preceding step. In any case, such gaps and cracks would be created in the regions covered by the second resin. Even in such cases, the second resin is barely affected or barely cracks, maintaining the condition of covering the cracks as if acting as a lid, as shown in FIG. 1B. Accordingly, the second resin shields any corrosive gas from reaching the silver-containing layer, thereby suppressing discoloration and corrosion.

Embodiment 2

Figure 2A:
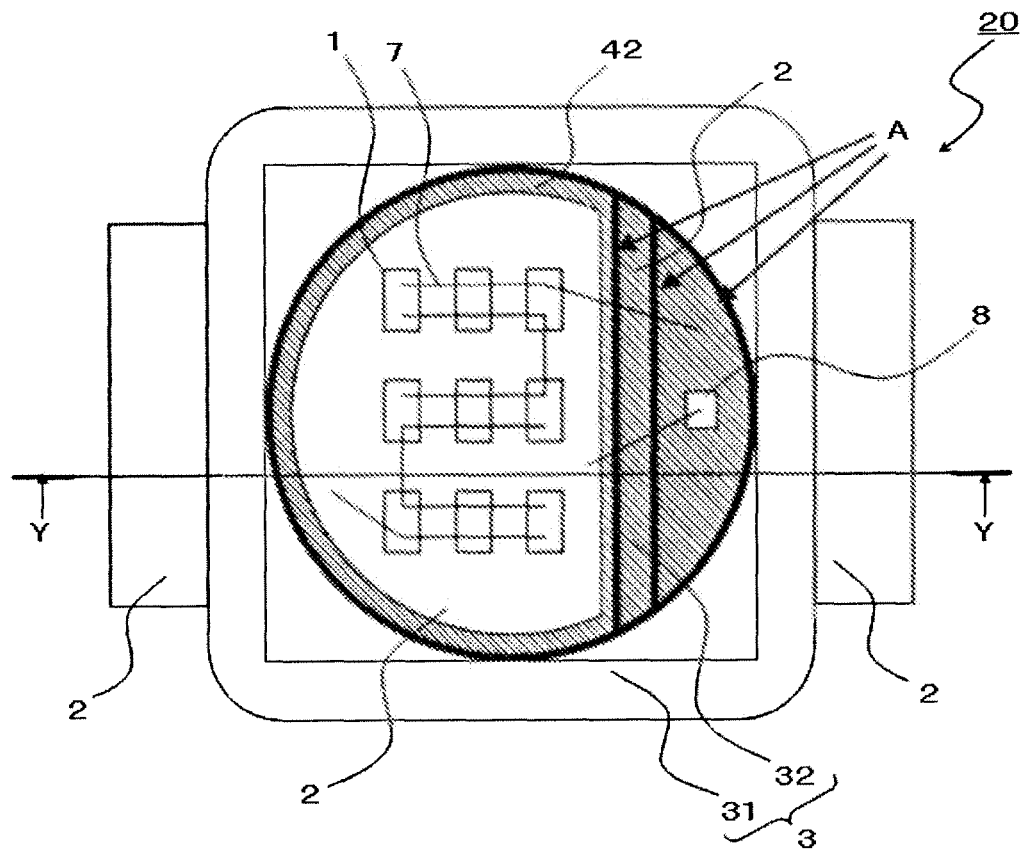
FIG. 2A is a top view of a light emitting device in another embodiment of the invention.
Figure 2B:
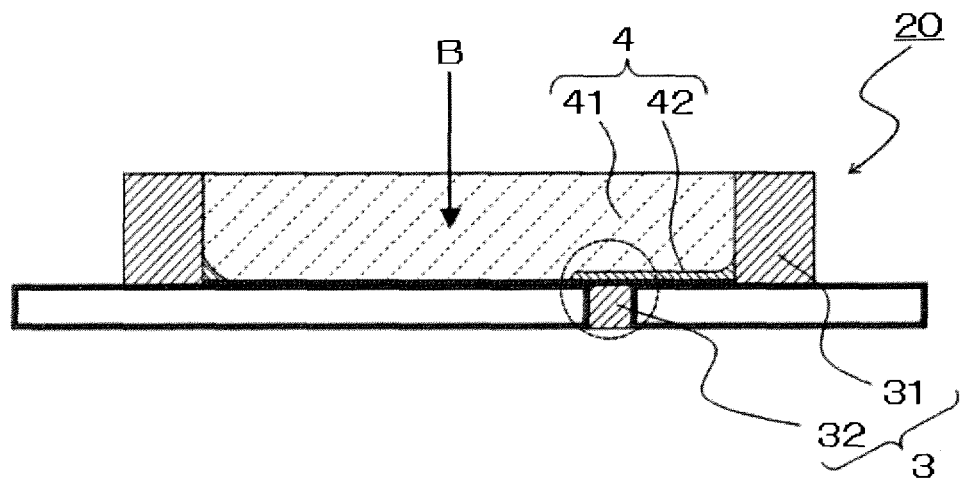
FIG. 2B is a cross section along line Y-Y in FIG. 2A.
Figure 2C:
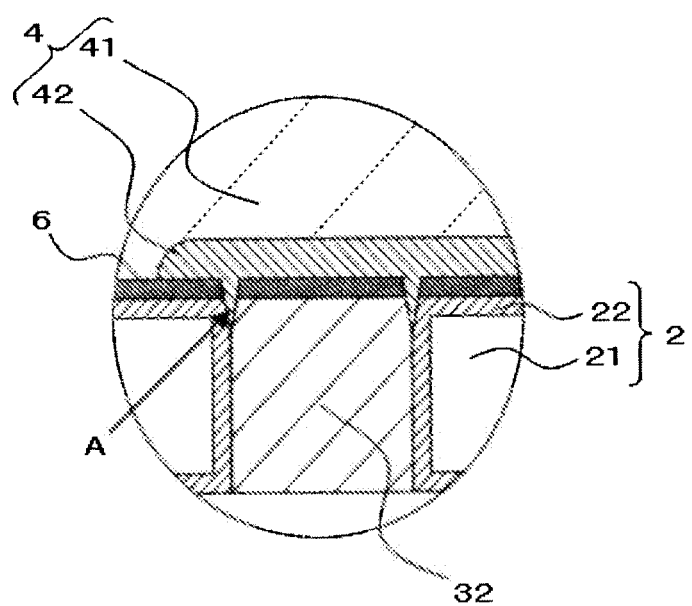
FIG. 2C is a partial enlarged view of FIG. 2B.

In the embodiment 2 of the invention, as shown in FIG. 2A and FIG. 2B, the light emitting device 20 comprise a base in which leads 2, which function as a pair of positive and negative electrodes, are secured by the resin molded body 3, which is an insulator. The base has a recess B, and the upper surfaces of the leads 2 are partially exposed at the bottom surface of the recess B. A lead 2 is a plate-shaped member in which a silver-containing layer 22 is disposed on the surface of the base material 21, and the light emitting elements 1, which are mounted on the lead 2 that is exposed at the bottom surface of the recess B, are connected to the lead 2 using a wire 7 so as to be electrically connectable. The inside of the recess B is covered by a protective film 6 made of an inorganic material, which is more specifically provided to cover the surfaces of the leads 2, the surfaces of the light emitting elements 1, the surfaces of the wires 7, and the surface of the resin molded body 3. Furthermore, a sealing resin 4 is disposed within the recess B via the protective film 6 (so as to cover the protective film 6). The protective film 6 has cracks at the boundaries A between the resin molded body 3 and the leads 2.

The sealing resin 4 has a first resin 41 that covers the light emitting elements 1, and a second resin 42 that covers the boundaries A between the leads 2 which are exposed at the bottom surface of the recess B and the resin molded body 3 (included here are the gaps between the resin molded body 3 and the leads 2, as well as the cracks in the protective film). For the second resin 42, a resin having a higher hardness than the first resin 41 is used.

As for the embodiment 2, the state is shown where the second resin was formed after the cracks were created in the protective film 6, as the gaps were formed between the resin molded body 3 and the leads 2 after forming the protective film 6 at the boundaries A. It further shows the case in which the gaps between the resin molded body 3 and the leads 2 had widened enough to allow the resin to penetrate, and the second resin penetrated into the gaps between the resin molded body 3 and the leads 2, as shown in FIG. 2B, thereby protecting the silver-containing layer exposed within the gaps. Since the second resin protects the silver-containing layer by penetrating deep into, and filling the gaps, the penetration of sulfur-containing gas from these sections can be suppressed. The gaps between the bottom section of the resin molded body and the leads are illustrated in the figure, but the same is true in cases where a gap is created between a side surface of the resin molded body and the leads. By controlling the viscosity and thixotrophy of the second resin, the wet spreadability on the upper surfaces of the leads, the penetration into the boundaries between the resin molded body and the leads utilizing a capillary phenomenon, or the like can be adjusted.

Moreover, unlike embodiment 1, a recess B is formed in the base in the embodiment 2. Inside such a recess B, the boundaries where the resin molded body 3 comes into contact with the leads 2 correspond to the sections indicated by bold lines in FIG. 2A, i.e., the outer perimeter of the bottom surface of the recess B (circular section), and the edges of the leads 2 that are in contact with the bottom surface 32 of the resin molded body (two vertical lines). These boundaries are slightly different in nature from one another. More specifically, the circular boundary is the boundary between the upper surfaces of the leads 2 and the side wall 31 of the resin molded body 3, whereas the two vertical lines are the boundaries between the bottom surface 32 of the resin molded body 3 and the side surfaces of the leads 2. Since cracks in the protective film 6 are readily created at any of the boundaries, it is preferable to dispose the second resin 42 so as to cover both. In doing so, the second resin may be disposed in sections that are apart from one another, or the second resin 42 can be disposed so as to integrally cover both the circular and vertical line boundaries A as shown in FIG. 2A. In the structure shown here, the edges of the vertical line boundaries A are in contact with the circular boundary A, and thus it is preferable to integrally dispose the second resin 42. In this way, the second resin is disposed so as to surround the first resin 41 that is disposed in the vicinity of the center of the lead 2 on which the light emitting elements 1 are mounted.

The lead 2 on the side where a protective element 8 is mounted has a small area that is exposed at the bottom surface of the recess, and for this reason, even the general central area of the exposed region (the general area where the protective element 8 is mounted in FIG. 2A) is a short distance from the resin molded body 3 (31, 32). Thus, the entire surface of the lead 2 is covered by the second resin 42. Since the connected section between the wire 7 and the lead 2 is covered by the second resin 42, the penetration of sulfur-containing gas components into the connected section can be more definitively suppressed. Since the second resin 42 is of a higher hardness than that of the first resin 41 to give higher priority to the function of suppressing the penetration of sulfur-containing gas components, it is not suited to cover the entire surface within the recess. For this reason, the second resin 42 is not disposed to cover the entire surface of the lead located on the side where the light emitting elements 1 are mounted, i.e., the lead that is exposed in the large area occupying the vast majority of the bottom surface of the recess, as shown in FIG. 2A.

As shown in FIG. 2B, moreover, in the cross sectional view of the light emitting device 20, the first resin occupies most of the recess B, and is disposed to cover the second resin. The first resin, furthermore, is disposed from the lower side of the recess to the upper side of the recess, so as to enclose the light emitting elements, wires, protective element, and the like. In comparison, the second resin is disposed thinly in some sections of the bottom surface side of the recess. When the volumes of the first and the second resins are compared, the first resin is overwhelmingly greater. Since the exposure of the leads in the recess B is limited to the bottom surface only, the leads never come into contact with the resin molded body in the upper side of the recess B, where there are no boundaries between them, and naturally no occurrences of gaps or cracks. Accordingly, providing the second resin 42 in very thin regions can effectively suppress the penetration of sulfur-containing gas.

The second resin, moreover, is preferably disposed to also cover the sections where the wires and the leads are connected. Cracks can occasionally be created in the protective film in the sections where the wires and the leads are connected due to exposure to thermal loads during the manufacturing process. Even in these cases, the cracks in the protective film can be protected by having the sections covered by the second resin.

Each member will be described in detail below.
(Lead)
A lead that comprises a base is a plate-shaped conductive member having a metal base material and a silver-containing layer on the surface thereof. At least a pair of leads that are electrically separated via a resin molded body is provided to function as positive and negative electrodes for supplying electricity to light emitting elements and protective elements, and are exposed in at least one part of the side or bottom surface of a light emitting device to allow electricity to be supplied from the outside. The size and shape can be selected from many in accordance with the purpose, application, manufacturing method, and the like. For example, as shown in FIGS. 1A and 1B, the leads can be disposed so that some sections of the side surface thereof form the side surface of the base, as well as the side surface of the light emitting device (so as to form the same side surface). Moreover, as shown in FIGS. 2A and 2B, the leads are disposed in such a way that one portion of each is exposed at the bottom surface of the recess of the base so that light emitting elements and a protective element can be mounted, and the wires can be connected.

For the base material of the leads, Fe, Cu, Ni, Al, or metals including these (alloys) is preferably used. Particularly, an alloy containing Fe and Cu is preferable, and an alloy containing Cu is more preferable. A plate-shaped lead that is machined into a desirable shape can be used, and in addition to plate-shaped leads, those with varying thicknesses in part, as shown in FIGS. 1B and 2B, as well as those that are vertically bent may also be used. The thickness, shape, or the like can vary in accordance with the shape or the like of light emitting devices. Moreover, the side surface of the lead that is in contact with the resin molded body (bottom surface) may be a plane, as shown in FIG. 2B, or the lead may be machined to have some sections of the side surface project so as to produce an anchoring effect, as shown in FIG. 1B. Even if such machining of the side surface of the lead creates a gap with the resin molded body, the passage for the penetration of sulfur-containing gas can be made longer, thereby suppressing the gas from reaching within the recess.

(Silver-Containing Layer)

The silver-containing layer disposed on the surface of the base material of the lead is suitably disposed to adjust the surface properties of the base material, such as increasing the reflectivity, improving wire adhesion, or the like. It is particularly preferable to dispose the layer to increase the light reflectivity from the light emitting element as compared to the base material, and a reflectivity of at least 70% over the wavelength range of visible light is preferable, and at least 80% is particularly preferable. This can increase the light extraction efficiency. Moreover, it is preferable for the layer to be highly glossy, having gloss of at least 0.5, more preferably at least 1.0, and even more preferably at least 1.6. The gloss values described here are obtained by using a micro color glossmeter VSR 300A made by Nippon Denshoku Industries Co., Ltd. when using irradiation at 45° and perpendicular incidence.

For the silver-containing layer, silver by itself, or any of the alloys of silver and Au, Pt, Rh, Pd, Os, Ru, Sn, In, Zn, Te, or the like can be used. The thickness of the layer is preferably 0.1 µm to 20 µm, and more preferably 1 µm to 5 µm. Such a silver-containing layer can be deposited directly over the base material, but preferably a layer of a different material (underlayer) is interposed thereunder, i.e. between the silver-containing layer and the base material, which can improve the adhesion of the silver-containing layer.

As an underlayer, it is preferable to use a metal that is less reactive to sulfur components as compared to silver, and more specifically Au, Au alloys, Pd, Pd alloys, and the like are preferable. Particularly, it is preferable to have an Au layer as the outermost surface, and Au alloys, Pd, Pd alloys, or the like may also be used. Before forming the outermost layer, a layer of metal other than those mentioned above may be formed by plating or strike plating. When Cu is used as the base material, in particular, it is preferable to form underlayers by depositing Ni, Pd, and Au in this order. Such an underlayer construction can suppress the diffusion of the base material Cu into the underlayers and silver-containing layer to suppress the decrease in the adhesion of each layer.

It is preferable to form the layers deposited on the surface of the base material, such as the silver-containing layer and underlayers, by plating. Moreover, it is preferable to pretreat the base material before plating. This includes an acid treatment using dilute sulfuric acid, dilute nitric acid, dilute hydrochloric acid, or the like, as well as an alkaline treatment using sodium hydroxide, or the like. Such pretreatment can be performed once or multiple times by repeating the same treatment, or combining different treatments. In cases where pretreatment is performed multiple times, it is preferable to rinse under running pure water after each treatment. In cases of a metal plate made of Cu or a Cu-containing alloy, dilute sulfuric acid is preferable, and in cases of a metal plate made of Fe or a Fe-containing alloy, dilute hydrochloric acid is preferable.

It is not necessary to form a silver-containing layer in the areas where the leads are embedded in the resin molded body. For example, the leads 2 that are not exposed at the bottom surface of the recess B of the base in the embodiment 2, i.e., the lead 2 embedded in the side wall 31 of the resin molded body 3, as well as the lead 2 projected externally, do not require a silver-containing layer disposed on their surfaces. For the lead 2 embedded in the resin molded body 3, in particular, it is preferable to keep the surface of the base material, which has more residual surface hydroxyl groups than Ag, as the lead surface as is, which can improve the adhesion between the resin molded body and the lead surface. Such partial plating can be easily accomplished by masking and protecting the sections where the silver-containing layer is not formed with a resist, protective tape, or the like, or a method of partially forming a silver-containing layer by installing a mold to plating equipment, or the like.

(Resin Molded Body)

The resin molded body that comprises a base is a member that integrally holds a pair of leads, and can be configured to have a substantially rectangular outline when the base is viewed from the top, as shown in FIG. 1A, or a square, polygon, or any combination of these. It may also be given a thickness to have the same planes as the upper and lower surfaces of the lead 2, as shown in FIG. 1B, or given different thicknesses so as to have the side wall sections and the bottom surface section as shown in FIG. 2B. In cases where the resin molded body has a recess, the inner side surface of the side wall may be disposed at a substantially right angle to the bottom surface, as shown in FIG. 2B, or may have a slanted or stepped surface. The height, shape of the opening, or the like can be appropriately selected in accordance with the purpose and application. The bottom surface section is disposed between the leads, and the width, location, or the like can be selected as desired.

For the resin molded body, a thermosetting or thermoplastic resin can be used, and a thermosetting resin is particularly preferred. As a thermosetting resin, it is preferable to use a resin having a lower gas permeability than that of the resin used as the sealing resin 4, and they more specifically include an epoxy resin composition, silicone resin composition, modified epoxy composition such as a silicone-modified epoxy resin composition, modified silicone resin composition such as an epoxy-modified silicone resin composition, polyimide resin composition, modified polyimide resin composition, urethane resin, modified urethane resin composition, or the like. It is preferable to adjust the transmittance by adding particles as fillers, such as $TiO_2$, $SiO_2$, $Al_2O_3$, MgO, $MgCO_3$, $CaCO_3$, $Mg(OH)_2$, $Ca(OH)_2$, or the like, to such a resin molded body material, so that the resin molded body reflects at least about 60% of the light from light emitting elements, more preferably about 90%.

(Sealing Resin)

A sealing resin is disposed on the flat top surface and the recess of the base, and in the embodiments of the invention, the sealing resin includes at least two types of resins; first and second resins. More specifically, the sealing resin has two types of resins; a first resin that covers the light emitting elements, and a second resin that covers the boundaries between the leads and the resin molded body, and has hardness that is higher than the first resin. The second resin is disposed so as to be covered by the first resin, i.e., after disposing the second resin to cover the boundaries in the base, the first resin is formed so as to cover the upper section of the second resin. For the first resin, potting, compression molding, printing, transfer molding, jet dispensing, or the like can be used. In cases where a plate-shaped base is used, as shown in FIG. 1B, compression molding and transfer molding are preferable, whereas in cases of a base having a recess, as shown in FIG. 2B, potting is preferable.

The first resin is a member that covers the light emitting elements and leads, as well as protecting them against dust, moisture, and external force. For the first resin, it is preferable to use materials that are translucent for all light from light emitting elements to pass through, and are also light resistant so as not to be readily degraded by the light. Specific materials include insulating resin compositions having translucency to allow light from the light emitting elements to pass through, such as a silicone resin composition, modified silicone resin composition, modified epoxy resin composition, fluorine resin composition, and the like. Particularly, hybrid resins containing at least one of the resins having a siloxane framework, such as dimethyl silicone, phenyl silicone with a small phenyl content, and fluorine-based silicone resin, may also be used. The hardness of these resins preferably is at least 10 JIS-A, but no greater than 90 D, more preferably, at least 40 JIS-A, but no greater than 70 D.

In addition to these materials, a coloring agent, light diffusing agent, reflector, various fillers, wavelength converter (phosphors), or the like may be included as desired. The outer surface shape of the first resin can be selected from many in accordance with the luminous intensity distribution property and the like. For example, by giving the shape of convex, concave, or Fresnel lens to the upper surface, the directive characteristics can be adjusted.

The second resin has a higher hardness than the first resin, and is a high gas-barrier. Creating a recess using the second resin would make the entire structure fragile and susceptible to cracking, and thus is preferable to partially dispose the second resin. As shown in FIG. 1B, the vast majority of the sealing resin is made up of the first resin, with the second resin being disposed in limited sections so as to fill the boundaries between the resin molded body and leads. The second resin can be disposed in close proximity to the light emitting elements, as well as the vicinity of the boundaries of the leads and resin molded body, as shown in FIG. 1A, i.e. at locations distant from the light emitting element. In cases where the second resin is disposed at locations distant from a light emitting element, where it is less susceptible to heat or light, even those resins with high hardness and excellent gas-barrier properties, but slightly lower heat resistance and light resistance, can be used.

It is sufficient to dispose the second resin to cover the boundaries of the resin molded body and leads, and is preferable to be additionally disposed to extend to the vicinities thereof. The "vicinity" is not particularly limited here, but can be controlled to some extent depending on the second resin's viscosity and the way it spreads. As a coating method, a jet dispenser, piston dispenser, tube dispenser, inkjet, or the like can be used, but any method capable of applying a small quantity of resin with accuracy in terms of weight and positioning can be used. By disposing the resin using a jet dispenser (Jet Valve DJ9500 by Nordson ASYMTEK), the second resin can be partially disposed in limited regions within the recess. After letting the second resin harden, the recess is filled with the first resin and hardened. The viscosity is preferably 10 Pa·s at most, more preferably 4 Pa·s at most.

The first resin is required to have excellent light transmittance from light emitting elements, but the transmittance is not particularly a question for the second resin. However, those that absorb light are not preferable for the second resin, and therefore it is preferable to use translucent resins, or reflective resins containing highly reflective fillers such as $TiO_2$. Moreover, the aforementioned wavelength converter or the like that is added to the first resin may be added.

Specific materials for the second resin include highly gas-barrier insulating resin compositions, such as a modified silicone resin composition, epoxy resin composition, modified epoxy resin composition, urethane resin composition, polyimide resin composition, acrylic resin composition, or the like. Epoxy resin compositions include glycidyl ethers, glycidyl esters, glycidyl amines, alicyclic epoxy, bisphenol epoxy, and the like. Urethane resin compositions include caprolactones, adipates, PTMG urethane, and the like. Polyimide resins include all-aromatic polyimides, and bismaleimide-based polyimides. Acrylate resins include poly methylacrylate resins. Preferably, a modified silicone resin composition having in molecules at least one functional group selected from the group consisting of epoxy, methacrylic, acrylic, isocyanate, isocyanurate, vinyl, and carbamate groups, and a silane coupling agent having a hydrolysable silicon group is used. It is preferable to use a resin having a hardness of at least 40 JIS-A, and vapor permeability, which indicate the gas-barrier property, of 15 g/mm²·day or less, and more preferably a hardness of at least 40 JIS-D and vapor permeability of 5 g/mm²·day or less. The film thickness of the second resin after application at maximum is 0.1 to 500 μm, more preferably 1 to 100 μm, and even more preferably 10 to 30 μm.

(Bonding Material)

A bonding material is used as a member to secure the light emitting elements on the lead. As for preferable materials, the following conductive bonding materials can be used: a conductive paste of silver, gold, palladium or the like; solders such as Au—Sn eutectic, Sn—Ag—Cu, or the like; brazing filler metals of low melting points; and particles or films of Cu, Ag, and Au used to bond between the same materials. In cases where the bonding material also needs to have a function of connecting the electrodes of the light emitting element to enable electrical connection as in the case of the embodiment 1, a conductive bonding material is used. As an insulating bonding material, an epoxy resin composition, silicone resin composition, polyimide resin composition and its modified resin, hybrid resin, or the like can be used. When these resins are used, a highly reflective metal layer, dielectric reflective film, such as an Al film, Ag film, or the like, can be provided on the rear face of the light emitting element, taking into account the degradation caused by light and heat from the light emitting element.

(Wire)

To supply electricity to a light emitting element, in addition to selecting a conductive bonding material from those discussed above to bond the electrodes of the light emitting element to the lead, a wire can also be used. The wire for connecting the electrodes of the light emitting element and the lead includes conductive wires using metals, such as gold, copper, platinum, aluminum, or the like, as well as alloys containing at least these metals. It is particularly preferable to use gold which is excellent in terms of thermal resistance and the like. Wires 7, as shown in FIG. 1A, may be configured to connect the light emitting elements together. Moreover, the configuration is not limited to this, and wires can be provided to connect each light emitting element to the lead.

(Protective Film)

The protective film is an inorganic material that covers the surface of the base or the interior of the recess, and is disposed to primarily suppress the discoloration and corrosion of the silver-containing layer on the surface of the leads. In the embodiments, the protective film is provided not only on the surface of the leads, but also on the surface of the resin molded body. The protective film is formed so as to span the upper surfaces of the resin molded body and the leads immediately after the formation, but in the subsequent processes it is allowed to have cracks in the regions corresponding to the boundaries of the resin molded body and leads, attributable to the difference in the coefficients of thermal expansion between the two while going through the steps involving temperature increases and decreases.

It is preferable to form such a protective film after mounting light emitting elements or after connecting wires, and various forming methods can be used, including methods for forming inorganic oxide and nitride films by way of sputtering, vapor deposition, ALD, CVD, corona discharge, plasma, thermal spraying, or the like, as well as methods using solutions such as polysilazane. Unlike sputtering, ALD (atomic layer deposition), in particular, is a method for forming layers of a reactive component one atomic layer at a time. A case of forming an aluminum oxide ($Al_2O_3$) protective film using TMA (trimethyl aluminum) and $H_2O$ will be explained below.

First, by introducing a TMA gas, the OH groups on the lead surface and TMA are reacted. After evacuating any excess gas, $H_2O$ gas is introduced to allow the TMA bonded with the OH groups in the preceding reaction to react with $H_2O$, and any excess gas is evacuated. By repeating these steps, an $Al_2O_3$ protective film of prescribed thickness can be formed.

The protective film obtained by ALD is of good quality and provides excellent protection as compared to other methods. However, the expansion and contraction of the resin molded body and lead occasionally cause the protective film 6 to crack at the interface between the two, as shown in FIG. 1D. For this reason, even if the penetration of sulfur-containing gas components is blocked on the upper surface of the lead 2, suppressing the penetration of the sulfur-containing gas components into the side surfaces of the lead exposed by the cracks in the protective film 6 is difficult. Disposing the second resin 42 on the protective film 6 at the cracks and the vicinities thereof can suppress the penetration of sulfur-containing gas components.

The materials for the protective film include oxides, such as $Al_2O_3$, which is mentioned above, $SiO_2$, $TiO_2$, $ZrO_2$, $ZnO_2$, $Nb_2O_5$, MgO, SrO, $In_2O_3$, $TaO_2$, HfO, SeO, $Y_2O_3$, or the like;

nitrides such as SiN, AlN, AlON, or the like; and fluorides such as $MgF_2$. These may be used singly or in combination, or formed in stacked layers.

The preferable thickness of the protective film slightly varies depending on the materials used, but about 1 nm to 300 nm is preferable, and 5 nm to 100 nm is more preferable. In cases where multiple layers are formed, it is preferable to keep the total thickness within these ranges. Moreover, it is preferable to form a dense layer so that gases such as sulfur or the like do not pass through easily.

(Light Emitting Element)

For light emitting elements, a semiconductor light emitting element having a desired emission wavelength can be selected. For example, for blue and green light emitting elements, those using ZnSe, nitride-based semiconductors ($In_XAl_YGa_{1-X-Y}N$, $0 \leq X$, $0 \leq Y$, $X+Y \leq 1$), or GaP can be used. For red light emitting elements, GaAlAs, AlInGaP, or the like can be used. Light emitting elements made of materials other than these may also be used. The composition, luminescent color, size, quantity, or the like can be appropriately selected in accordance with the purpose.

In cases where a light emitting device includes a phosphor, nitride semiconductors capable of emitting light with a short wavelength to efficiently excite the phosphor are suitable. The wavelength of light emitted can be selected from many by adjusting the semiconductor layer materials and mixture ratio.

The light emitting element can be adopted to output not only light in the visible light range, but also ultraviolet or infrared light. Furthermore, a photo detector or the like can be installed together with light emitting elements.

2. Lighting Equipment

Lighting equipment using the light emitting device according to embodiments of the present invention will be explained. The light emitting devices divided into discrete pieces from an assembly thereof are secondarily mounted onto a printed wiring board, ceramic wiring board, or the like using solder or the like. A wiring board is used to connect various types of electronic components besides the light emitting devices. For the printed wiring board, any of the following can be used: rigid boards, such as glass epoxy boards, glass silicone boards, alumina ceramic boards, LTCC boards, and Teflon™ boards; and flexible boards, such as an insulating substrate made of a polyimide film or the like, on which conductive circuits are formed. For the wiring circuit, those formed by build-up or subtractive processing using photoresist, or those formed by printing using a conductive paste can be used. In the sections of the wiring board surface where electronic components are connected, Cu, Ni, Ag, Sn, or the like is exposed, and the remaining portion is protected by insulating solder resist or the like. The exposed metal surface may be coated with a preflux or corrosion inhibitor. On a wiring board for use in mounting LED devices, besides the light emitting devices, a connector, power circuit, heat dissipater, controller, and the like are mounted, which is then assembled with optical components such as a lens, as well as a housing to complete the lighting equipment.

(Bonding Material for Secondary Mounting)

Light emitting devices are mounted on a wiring board using a SnAg—, SnCu—, SnPb—, SnBi—, or SnAgCu- based solder. In cases where a resin-based printed wiring board is used, in particular, metals such as a lead-free SnAgCu-based cream solder is used, and the light emitting devices are secondarily mounted by metal bonding at a temperature of at least 200° C. For example, in a case where $Sn_3Ag_{0.5}Cu$ is used, after printing a pattern with the $Sn_3Ag_{0.5}Cu$ cream solder on a wiring board in the location where the light emitting devices are to be mounted, and placing the light emitting devices thereon, the light emitting devices are bonded onto the wiring board at approximately 270° C. using a reflow apparatus which is controlled to a low concentration of oxygen. Depending on the heat profile during the process, the protective films may occasionally crack due to the difference in the linear expansion between the leads and resin molded body in the light emitting device, as well as the differences in the strength and linear expansion among the leads, resin molded body, and protective film. Even in such a case, discoloration and corrosion of the silver can be suppressed in the light emitting devices obtained in the embodiments because the boundaries between the resin molded body and leads are covered.

EXAMPLE

An example of an embodiment of the present invention will be explained in detail below. The present invention, needless to say, is not limited to the example discussed below.

Example 1

Bases on which leads are secured with resin molded bodies are prepared. Until the devices are ultimately divided into discrete pieces, they go through each step in the condition of an assembly of bases having a lead frame with connected leads on which multiple resin molded bodies are formed. For the sake of convenience, however, one light emitting device (singular) shown in FIG. 2A is used in the explanation.

Leads 2 are formed by stacking Ni, Pd, Au, and Ag layers, in that order, on the surface of the base metal plate made of a Cu alloy (194 material) by plating. Two leads are secured by a resin molded body to comprise a base so as to function as a pair of positive and negative electrodes. The resin molded body 3 has a thermosetting white epoxy resin composition as a major component, and includes various additives such as $TiO_2$. On the leads 2 in the recess of the base, light emitting elements are mounted and bonded using an Au—Sn eutectic as a bonding material through reflow and cleaning steps. A protective element is also mounted and bonded using a resin bonding material through a hardening step.

Using an Au wire, the light emitting elements, protective element, and leads 2 are connected. Subsequently, as a protective film made of an inorganic material, $SiO_2$ is formed on the surface of the base (resin molded body and leads) by ALD to a thickness of 100 nm (here, the thickness refers to that above the leads in the recess).

Next, 2 to 5 dots of the second resin are applied using a jet dispenser so as to cover the boundaries between leads 2 and resin molded body 3 in the recess of the base. As the second resin, a modified silicone composition having isocyanurate groups, and a viscosity of 2 Pa·s is used. The hardness of the second resin when hardened is 90 JIS-D, vapor permeability 6 $g/mm^2$·day, and thickness at the maximum point 20 µm. Since the second resin is inferior to the first resin in terms of both light resistance and heat resistance, the wet spreadability is adjusted so as not to come in contact with the light emitting elements.

After allowing the second resin to harden, the recess is filled with the YAG-based phosphor-containing first resin, and hardened. For the first resin, dimethyl silicone which has good heat resistance and light resistance is used. The hardness of the first resin when hardened is 50 JIS-A, and vapor permeability about 100 $g/mm^2$·day. When the first resin is hardened, the assembly is divided into discrete pieces using a die cutting press to obtain the light emitting devices.

The light emitting device obtained has cracks in some sections of the boundaries between the leads and the resin molded body within the recess, and these sections are covered by the second resin. Thus, in a corrosion test in an environment containing 15 ppm of hydrogen sulfide gas, the light emitting device's luminous flux maintenance factor after 1,000 hours is twice that of unprocessed products.

The light emitting devices of the invention can be utilized in various display devices, lighting equipment, display monitors, backlight source for liquid crystal display monitors, image reading devices in digital video cameras, facsimile machines, copiers, scanners, and the like, as well as projectors.

What is claimed is:

1. A light emitting device comprising:
    a base comprising at least one pair of leads and a resin molded body, the leads having a silver-containing layer on their surfaces and being secured by the resin molded body,
    at least one light emitting element mounted on at least one of said leads,
    a protective film made of an inorganic material that covers an upper surface of said base, and
    a sealing resin disposed on the upper surface of the base via said protective film, said sealing resin comprising a first resin and a second resin having a higher hardness than the first resin,
    wherein the first resin covers said light emitting element and covers an upper surface of the second resin, and
    wherein the second resin covers boundaries between said resin molded body and said leads.

2. The light emitting device according to claim 1, wherein said base has a recess, and a lead on which said light emitting element is mountable is exposed at a bottom surface of said recess.

3. The light emitting device according to claim 1, wherein said second resin has a hardness of at least 40 JIS-A.

4. The light emitting device according to claim 1, wherein said second resin has a vapor permeability of 15 g/mm$^2$·day at most.

5. The light emitting device according to claim 1, wherein said leads are made of a Cu-containing alloy.

6. Lighting equipment having a light emitting device according to claim 1, said light emitting device being mounted on a wiring board by metal bonding using a metal having a melting point of at least 200° C.

7. The light emitting device according to claim 1, wherein the second resin covers perimeters of rectangular sections of the leads and extending sections that extend from a side of the rectangular sections to a side face of the base.

8. The light emitting device according to claim 1, wherein the boundaries are areas where the resin molded body and the leads are in contact with one another.

9. The light emitting device according to claim 1, wherein the boundaries are areas wherein a gap is disposed between the resin molded body and the leads.

10. The light emitting device according to claim 1, wherein the at least one light emitting element straddles two of the leads.

11. The light emitting device according to claim 1, wherein the at least one light emitting element comprises a plurality of light emitting elements.

12. The light emitting device according to claim 1, wherein the light emitting device comprises a plurality of the light emitting elements that are mounted on one of the leads and connected to another of the leads via at least one wire.

13. The light emitting device according to claim 1, wherein said base has a recess surrounded by a side wall of the resin molded body, and the second resin covers boundaries between the side wall and the leads.

14. The light emitting device according to claim 1,
    wherein said base has a recess surrounded by a side wall of the resin molded body,
    wherein the second resin covers (i) boundaries between the side wall and the leads, and (ii) boundaries between a bottom surface of the resin molded body and the leads, and
    wherein a portion of the resin that covers the boundaries between the side wall and the leads is disposed to be continuous with a portion of the resin that covers the boundaries between the bottom surface of the resin molded body and the leads.

15. The light emitting device according to claim 14,
    wherein the light emitting device comprises a plurality of the light emitting elements that are mounted on one of the leads and connected to another of the leads via at least one wire, and
    wherein the second resin is disposed so as to surround a portion of the first resin that is disposed in a vicinity of a center of a lead on which the plurality of the light emitting elements are mounted.

16. The light emitting device according to claim 1,
    wherein said base has a recess surrounded by a side wall of the resin molded body, and
    wherein the first resin occupies a majority of the recess and is disposed so as to cover the second resin.

17. The light emitting device according to claim 1, wherein the silver-containing layer has a thickness between 0.1 microns and 20 microns.

18. The light emitting device according to claim 17, wherein the silver-containing layer has a thickness between 1 micron and 5 microns.

19. The light emitting device according to claim 1, wherein the second resin comprises a modified silicone resin having at least one functional group selected from the group consisting of epoxy, methacrylic, acrylic, isocyanate, isocyanurate, vinyl, and carbamate groups.

20. The light emitting device according to claim 1, wherein the second resin has a thickness of 0.1 to 500 microns.

* * * * *